United States Patent
Lee et al.

(10) Patent No.: US 7,440,320 B2
(45) Date of Patent: Oct. 21, 2008

(54) ROW DECODER FOR PREVENTING LEAKAGE CURRENT AND SEMICONDUCTOR MEMORY DEVICE INCLUDING THE SAME

(75) Inventors: Jong-Hoon Lee, Suwon-si (KR); Jin-Yub Lee, Seoul (KR); Sang-Won Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/484,176

(22) Filed: Jul. 11, 2006

(65) Prior Publication Data

US 2007/0147164 A1    Jun. 28, 2007

(30) Foreign Application Priority Data

Dec. 28, 2005    (KR) .................... 10-2005-0131459

(51) Int. Cl.
*G11C 11/34* (2006.01)
*G11C 8/99* (2006.01)

(52) U.S. Cl. ........................ 365/185.11; 365/185.18; 365/185.23; 365/230.06

(58) Field of Classification Search ............ 365/185.11, 365/185.13, 185.17, 185.18, 185.23, 185.33, 365/230.06
See application file for complete search history.

(56) References Cited

U.S. PATENT DOCUMENTS

| | | | | |
|---|---|---|---|---|
| 5,963,475 A * | 10/1999 | Choi et al. | ............. | 365/185.11 |
| 6,031,760 A * | 2/2000 | Sakui et al. | ............. | 365/185.21 |
| 6,044,017 A * | 3/2000 | Lee et al. | ................ | 365/185.11 |
| 6,240,014 B1 | 5/2001 | Yoo | ........................ | 365/185.09 |
| 6,333,662 B1 | 12/2001 | Umezawa et al. | ............ | 327/333 |
| 6,560,162 B2 * | 5/2003 | Kwon | ..................... | 365/185.11 |
| 6,587,375 B2 * | 7/2003 | Chung et al. | ........... | 365/185.11 |
| 6,731,540 B2 * | 5/2004 | Lee et al. | ................ | 365/185.11 |
| 7,064,986 B2 * | 6/2006 | Lee et al. | ................ | 365/185.23 |
| 7,184,307 B2 * | 2/2007 | Lee | ........................ | 365/185.11 |
| 7,200,039 B2 * | 4/2007 | Lee | ........................ | 365/185.13 |

FOREIGN PATENT DOCUMENTS

| | | |
|---|---|---|
| JP | 2000-195284 | 7/2000 |
| JP | 2001-52499 | 2/2001 |
| KR | 10-2000-0044917 | 7/2000 |
| KR | 10-0305032 | 7/2001 |

* cited by examiner

*Primary Examiner*—Trong Phan
(74) *Attorney, Agent, or Firm*—Mills & Onello LLP

(57) ABSTRACT

A row decoder preventing leakage current and a semiconductor memory device including the same are provided. The row decoder includes an address decoder and a selection signal generator. The address decoder decodes a predetermined address signal and activates an enable signal. The selection signal generator electrically connects a boosted voltage node to an output node to activate a block selection signal when the enable signal is activated and electrically breaks a path between the boosted voltage node and the output node and a path between the boosted voltage node and a ground voltage node when the enable signal is deactivated. The selection signal generator includes a feedback circuit, a switch, and a direct current (DC) path breaker. The feedback circuit is electrically connected to the output node to generate an output voltage that varies with a voltage level of the block selection signal. The switch transmits the output voltage of the feedback circuit to the output node. The DC path breaker turns on the switch when the enable signal is activated and turns off the switch when the enable signal is deactivated. Accordingly, when a supply voltage applied to the semiconductor memory device is low, a DC path is broken in the row decoder, thereby preventing the leakage current.

12 Claims, 5 Drawing Sheets

ROW DECODER FOR PREVENTING LEAKAGE CURRENT AND SEMICONDUCTOR MEMORY DEVICE INCLUDING THE SAME

BACKGROUND OF THE INVENTION

This application claims the priority of Korean Patent Application No. 10-2005-0131459, filed on Dec. 28, 2005, in the Korean Intellectual Property Office, the contents of which are incorporated herein in their entirety by reference.

1. Field of the Invention

The present invention relates to a semiconductor memory device, and more particularly, to a row decoder for preventing leakage current from occurring even at a low supply voltage in a non-volatile memory device.

2. Description of the Related Art

A non-volatile semiconductor memory device such as a flash electrically erasable programmable read-only memory (EEPROM) device is usually used as a data storage device in a portable electronic system. Among various types of non-volatile semiconductor memory devices, NAND flash semiconductor memory devices having a NAND-type memory cell and NOR flash semiconductor memory devices having a NOR-type memory cell are commonly used.

In a flash memory device, a row decoder or a high-voltage switch has a direct current (DC) path when a supply voltage is low (e.g., "1.6V"), resulting in high power consumption. In the flash memory device, a boosted voltage higher than a supply voltage is internally used. The row decoder is a circuit which also needs the boosted voltage. Accordingly, when a DC path is formed from a boosted voltage node, power consumption increases.

FIG. 1 is a circuit diagram of a conventional row decoder 500. Referring to FIG. 1, when an enable signal EN is activated to a "high" level (1), a voltage of a gate 511 of a high-voltage positive-channel metal-oxide semiconductor (PMOS) transistor 541 transitions to a ground voltage level and the high-voltage PMOS transistor 541 is turned on. Then, a voltage of a node 512 is gradually increased by a negative-channel MOS (NMOS) depletion transistor 531 receiving the feedback of an output signal OUT. As a result, the voltage of the output signal OUT increases to the level of a boosted voltage VPP.

However, when the enable signal EN is deactivated, the voltage of a first node 511, an output node of an inverter 551, has a level of a supply voltage VCC and the output voltage of an inverter 552 has a ground voltage level (0 V). Accordingly, an NMOS transistor 521 and an NMOS depletion transistor 532 are turned on, and thus an electrical path is formed from an output node 513 to a ground voltage node (not shown) of the inverter 552. As a result, the voltage level of the output signal OUT decreases to 0 V. Assuming that the supply voltage VCC is about 1.6 V, when the threshold voltage of the NMOS depletion transistor 531 is about −2.5 V, the voltage of the node 512 is about 2.5 V. Accordingly, a voltage difference occurs between a source and a gate of the PMOS transistor 541 and the PMOS transistor is turned on. Then, as shown in FIG. 1, a DC path is formed between a boosted voltage node (VPP) and the ground voltage node, which causes an increase in power consumption.

As described above, in conventional decoders, a DC path is formed even when an enable signal is deactivated, and therefore, power consumption increases.

SUMMARY OF THE INVENTION

The present invention provides a row decoder for reducing power consumption by breaking a direct current (DC) path that may be formed at a low supply voltage and provides a semiconductor memory device including the row decoder.

According to an aspect of the present invention, there is provided a row decoder including an address decoder and a selection signal generator. The address decoder decodes a predetermined address signal and activates an enable signal. The selection signal generator electrically connects a boosted voltage node to an output node to activate a block selection signal when the enable signal is activated and electrically breaks a path between the boosted voltage node and the output node and a path between the boosted voltage node and a ground voltage node when the enable signal is deactivated.

The selection signal generator may comprise a feedback circuit, a switch and a direct current (DC) path breaker. The feedback circuit is electrically connected to the output node to generate an output voltage that varies with a voltage level of the block selection signal. The switch transmits the output voltage of the feedback circuit to the output node. The direct current (DC) path breaker turns on the switch when the enable signal is activated and turns off the switch when the enable signal is deactivated.

In one embodiment, the feedback circuit comprises a first negative-channel metal-oxide semiconductor (NMOS) depletion transistor having a first terminal connected to the output node and a second terminal receiving a boosted voltage, and the switch comprises a first positive-channel MOS (PMOS) transistor which is connected between the NMOS depletion transistor and the output node and turned on or off in response to an output voltage of the DC path breaker.

In one embodiment, the DC path breaker makes a voltage of a gate of the first PMOS transistor become a level of a ground voltage when the enable signal is activated and makes it become equal to or higher than a voltage of a source of the first PMOS transistor when the enable signal is deactivated.

In one embodiment, the selection signal generator further comprises a discharge circuit discharging a voltage of the output node when the enable signal is deactivated, and the discharge circuit comprises a second NMOS depletion transistor connected between the output node and a predetermined node and a first NMOS transistor connected between the predetermined node and a node receiving the enable signal.

In one embodiment, the DC path breaker comprises: a third NMOS depletion transistor having a terminal connected to the boosted voltage node; a second PMOS transistor connected between the third NMOS depletion transistor and the gate of the first PMOS transistor; and a second NMOS transistor which is connected between the gate of the first PMOS transistor and the ground voltage node and is turned on or off in response to the enable signal.

According to another aspect of the present invention, there is provided a semiconductor memory device including a memory cell array, a row decoder, and a row-line voltage level selector. The memory cell array includes first through n-th memory blocks where "n" is 2 or a natural number greater than 2. The row decoder decodes a block address signal and activates one block selection signal among first through n-th block selection signals to select one memory block among the first through n-th memory blocks. The row-line voltage level selector decodes a word line address signal and generates voltages to be respectively applied to row lines in a memory block corresponding to the activated block selection signal.

The row decoder may comprise an address decoder and first through n-th selection signal generators. The address decoder decodes the block address signal and activates one enable signal among first through n-th enable signals. The first through n-th selection signal generators each electrically connects a boosted voltage node to an output node to activate a corresponding block selection signal when a corresponding enable signal among the first through n-th enable signals is activated and electrically breaks a path between the boosted voltage node and the output node and a path between the boosted voltage node and a ground voltage node when the corresponding enable signal is deactivated.

In one embodiment, each of the first through n-th selection signal generators comprises: a feedback circuit electrically connected to the output node to generate an output voltage that varies with a voltage level of the corresponding block selection signal; a switch transmitting the output voltage of the feedback circuit to the output node; and a direct current (DC) path breaker turning on the switch when the corresponding enable signal is activated and turning off the switch when the corresponding enable signal is deactivated.

In one embodiment, the feedback circuit comprises a first negative-channel metal-oxide semiconductor (NMOS) depletion transistor having a first terminal connected to the output node and a second terminal receiving a boosted voltage, and the switch comprises a first positive-channel MOS (PMOS) transistor which is connected between the NMOS depletion transistor and the output node and turned on or off in response to an output voltage of the DC path breaker.

In one embodiment, each of the first through n-th selection signal generators further comprises a discharge circuit discharging a voltage of the output node when the corresponding enable signal is deactivated, and the discharge circuit comprises a second NMOS depletion transistor connected between the output node and a predetermined node and a first NMOS transistor connected between the predetermined node and a node receiving the enable signal.

In one embodiment, the DC path breaker comprises: a third NMOS depletion transistor having a terminal connected to the boosted voltage node; a second PMOS transistor connected between the third NMOS depletion transistor and the gate of the first PMOS transistor; and a second NMOS transistor which is connected between the gate of the first PMOS transistor and the ground voltage node and is turned on or off in response to the enable signal, and the third NMOS depletion transistor is shared by the first through n-th selection signal generators.

In one embodiment, the first through n-th selection signal generators share a single body of the second PMOS transistor.

In one embodiment, the semiconductor memory device is a flash memory device.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1:
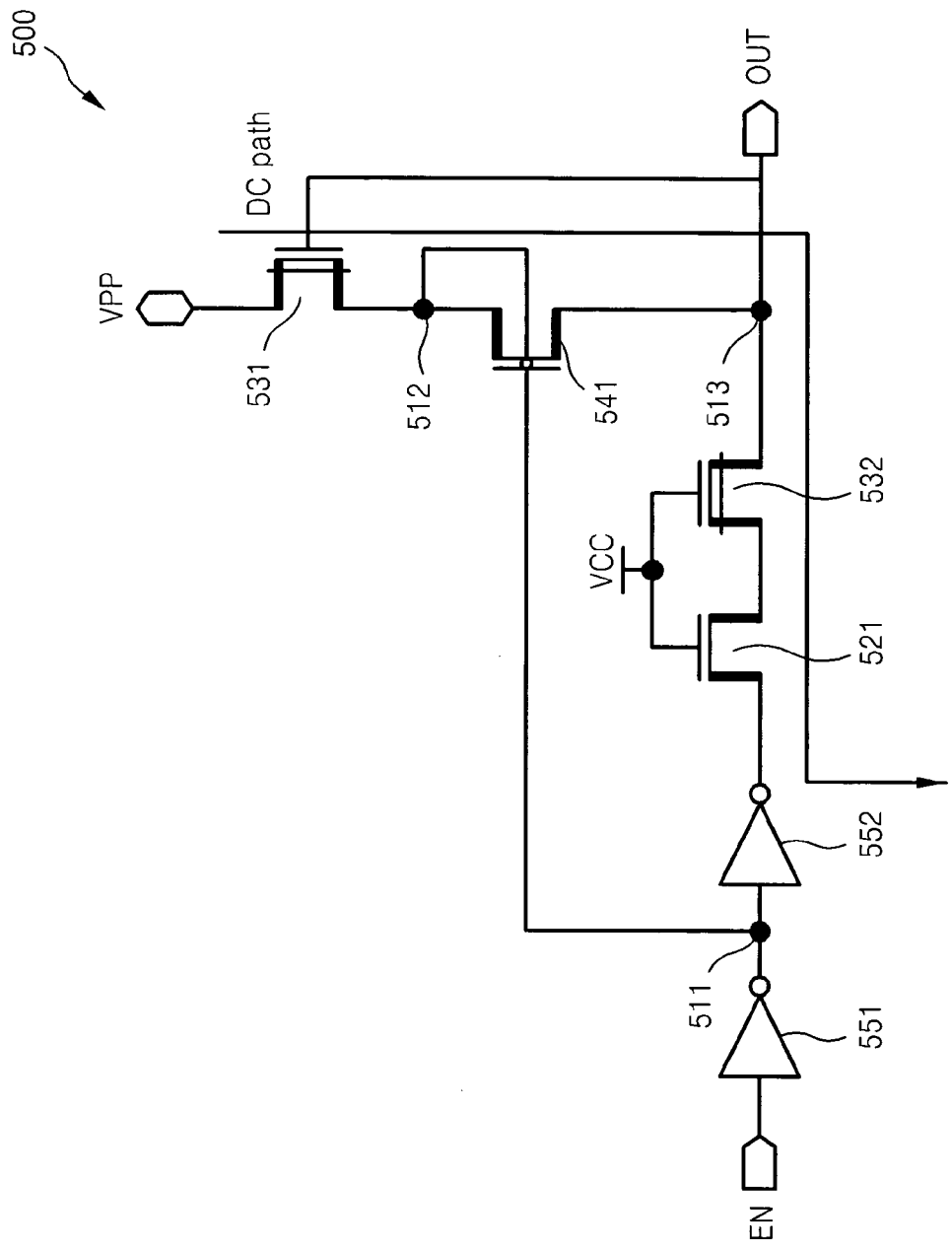
FIG. 1 is a circuit diagram of a conventional row decoder.
Figure 2:
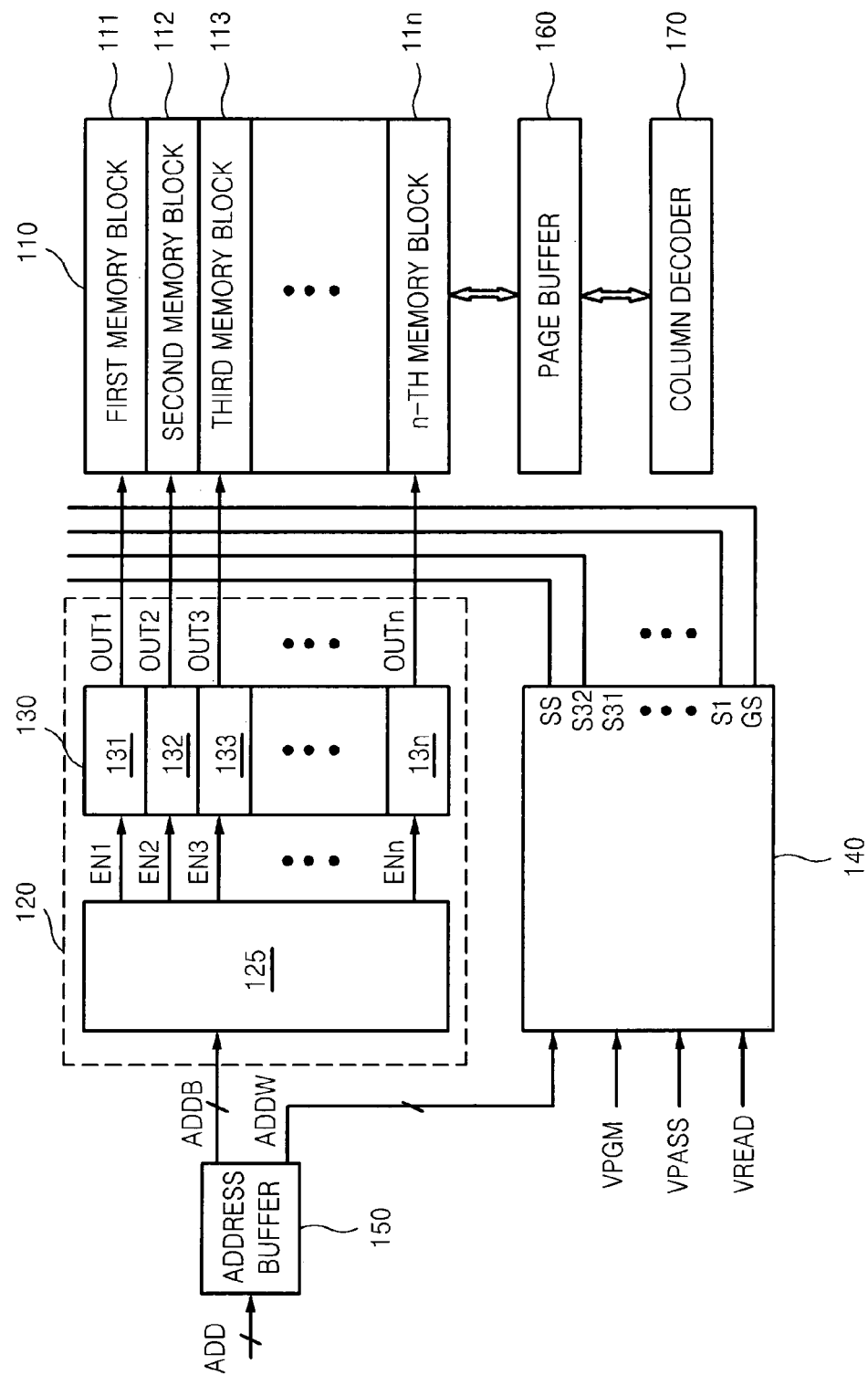
FIG. 2 is a schematic block diagram of a flash memory device according to an embodiment of the present invention.
Figure 3:
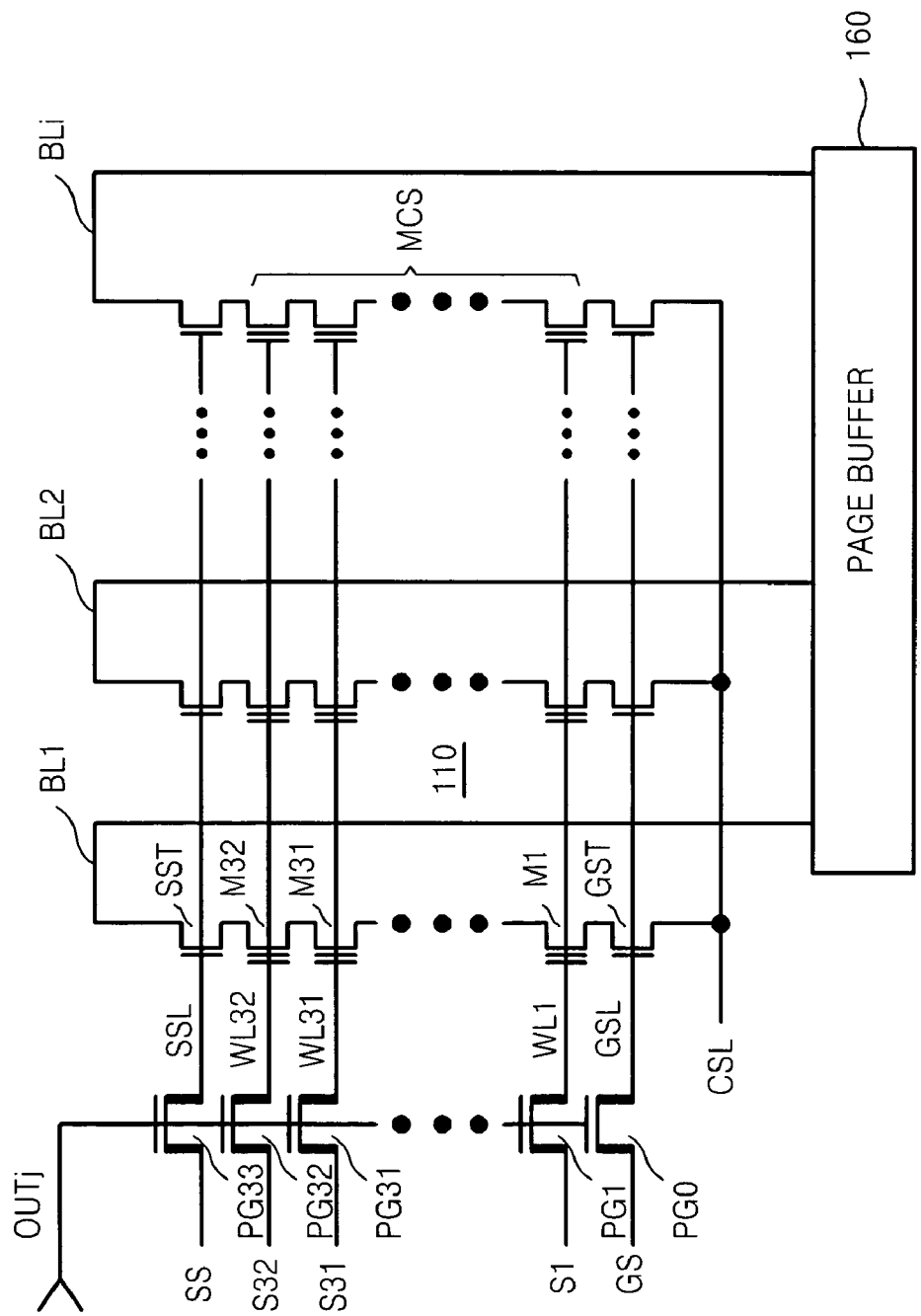
FIG. 3 is a circuit diagram of a single memory block shown in FIG. 1.

FIG. 2 is a schematic block diagram of a flash memory device 100 according to an embodiment of the present invention. FIG. 3 is a circuit diagram of a single memory block shown in FIG. 2.

Referring to FIG. 2, the flash memory device 100 includes a memory cell array 110, a row decoder (i.e., an X-decoder) 120, a row-line voltage level selector 140, an address buffer 150, a page buffer 160, and a column decoder 170.

The memory cell array 110 includes a plurality of (i.e., "n") memory blocks 111, 112, 113, . . . , 11n. As shown in FIG. 3, each of the "n" memory blocks 111 through 11n includes a plurality of bit lines BL1, BL2, . . . , BLi and memory cell strings MCS connected to each of the bit lines BL1 through BLi.

The address buffer 150 buffers and outputs an address signal ADD. The row decoder 120 decodes a block selection address ADDB of the address signal ADD and outputs block selection signals OUT1, OUT2, OUT3, . . . , OUTn to select one memory block among the "n" memory blocks 111 through 11n. The row-line voltage level selector 140 decodes a word line selection address ADDW of the address signal ADD and selects and outputs voltage levels SS, S32, S31, . . . , S1, and GS to be applied to respective row lines SSL, WL32 through WL1, and GSL (FIG. 3) in each memory block using a plurality of voltages VPGM, VPASS, and VREAD. Data of the memory cell array 110 is output through the page buffer 160. The column decoder 170 selects a bit line through which the data is to be input/output.

The structure of each memory block shown in FIG. 2 will be described in detail with reference to FIG. 3 below. The memory cell strings MCS respectively include a plurality of (32 in this embodiment) cell transistors M1 through M32 for each of the bit lines BLj (where j=1 through i). The cell transistors M1 through M32 are connected in series between a source of a string selection transistor SST and a drain of a ground selection transistor GST. A drain of the string selection transistor SST is connected to a corresponding bit line BLj and a source of the ground selection transistor GST is connected to a common source line CSL.

Gates of string selection transistors SST respectively connected to the bit lines BLj are connected in common to the string selection line SSL. Gates of the ground selection transistors GST are connected in common to the ground selection line GSL. Control gates of cell transistors M1 through M32 in one memory cell string MCS are respectively connected in to a corresponding word line among the word lines WL1 through WL32. This feature is also applied to the cell transistors M1 through M32 in another memory cell string MCS. The row lines in the memory block, i.e., the string selection line SSL, the ground selection line GSL, and the word lines WL1 through WL32 receive the row-line selection voltages SS, S32, S31, . . . , S1, and GS output from the row-line voltage level selector 140 through transistors PG0 through PG33, respectively, which are turned on or off in response to the corresponding block selection signals OUTj (where j=1 through n), respectively.

Referring back to FIG. 2, the row decoder 120 includes an address decoder 125 and a block selection signal generation circuit 130. The block selection signal generation circuit 130 includes first through n-th selection signal generators 131 through 13n. The address decoder 125 decodes the block selection address ADDB and generates enable signals EN1, EN2, EN3, . . . , ENn for selecting one memory block among the "n" memory blocks 111 through 11n. The first through n-th selection signal generators 131 through 13n activate the corresponding block selection signals OUT1 through OUTn, respectively, in response to the corresponding enable signals EN1 through ENn, respectively. Each of the block selection signals OUT1 through OUTn, as shown in FIG. 3, turns on the transistors PG0 through PG33 so that the row-line selection voltages SS, S32 through S1, and GS generated by the row-line voltage level selector 140 are applied to the row lines SSL, WL32 through WL1, and GSL in a corresponding memory block.

Figure 4:
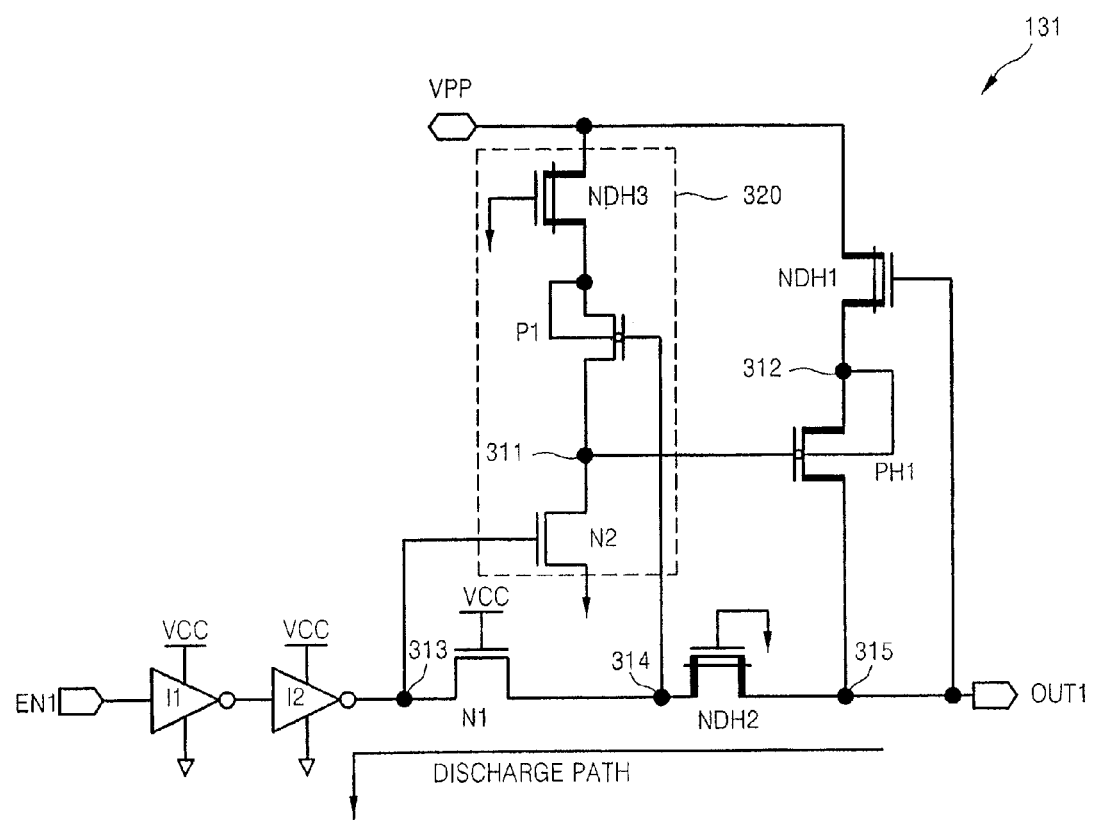
FIG. 4 is a circuit diagram of a first selection signal generator shown in FIG. 1.

FIG. 4 is a circuit diagram of the first selection signal generator 131 shown in FIG. 2. The first selection signal generator 131 includes a feedback transistor NDH1, a switch transistor PH1, a direct current (DC) path breaker 320, an NMOS transistor N1, an NMOS depletion transistor NDH2, and inverters I1 and I2.

The feedback transistor NDH1 may be a high-voltage NMOS depletion transistor. The feedback transistor NDH1 is connected to an output node 315 to receive the feedback of the block selection signal OUT1 and varies the voltage of a node 312 according to the voltage level of the block selection signal OUT1. The switch transistor PH1 may be a high-voltage PMOS transistor. The switch transistor PH1 is turned on when the enable signal EN1 is activated (to a high level in this embodiment) and transmits the voltage of the node 312 to the output node 315 to increase the voltage level of the block selection signal OUT1 to a level of a boosted voltage VPP.

The DC path breaker 320 turns on the switch transistor PH1 when the enable signal EN1 is activated and turns off the switch transistor PH1 when the enable signal EN1 is deactivated (to a low level in this embodiment). In detail, to control the switch transistor PH1, the DC path breaker 320 operates such that the voltage of a gate 311 of the switch transistor PH1 has a ground voltage level when the enable signal EN1 is activated and has a level equal to or higher than the voltage of a source 312 of the switch transistor PH1 when the enable signal EN1 is deactivated. The DC path breaker 320 includes an NMOS depletion transistor NDH3, a PMOS transistor P1, and an NMOS transistor N2.

A gate of the NMOS depletion transistor NDH3 is connected to a ground voltage. Since the threshold voltage of the NMOS depletion transistor NDH3 is lower than 0 (e.g., about −2.5 V), the NMOS depletion transistor NDH3 is always in an on-state. Accordingly, a source of the NMOS depletion transistor NDH3 has a voltage +2.5 V higher than the gate. That is, the source of the NMOS depletion transistor NDH3 has a voltage of about 2.5 V.

When the enable signal EN1 is activated, the first selection signal generator 131 operates as follows.

The voltage of an output node 313 of the inverter I2 has a level of a supply voltage VCC, and thus the NMOS transistor N2 of the DC path breaker 320 is turned on. Accordingly, the gate voltage (i.e., the voltage of the node 311) of the switch transistor PH1 has a low level of about 0 V and the switch transistor PH1 is turned on. When it is assumed that the output signal OUT1 initially has a 0 V and the threshold voltage of the feedback transistor NDH1 is about −2.5 V, the voltage of the node 312 is about 2.5 V. The voltage of the node 312 is output to the output signal OUT1 through the switch transistor PH1 that has been turned on. Accordingly, the voltage of the output signal OUT1 increases to 2.5 V. When the voltage of the output signal OUT1 becomes 2.5 V, the voltage of the node 312 becomes 5 V, and therefore, the voltage of the output signal OUT1 also increases to 5 V. As described above, as the output signal OUT1 is fed back to the gate of the feedback transistor NDH1, the voltage of the node 312 and the voltage of the output signal OUT1 gradually increase until the voltage of the output signal OUT1 has a level of the boosted voltage VPP.

The voltage of a node 314 is about 2.5 V due to the NMOS depletion transistor NDH2, and thus the PMOS transistor P1 of the DC path breaker 320 is turned off. As a result, a path between the boosted voltage VPP and the node 311 is broken. In addition, since the NMOS transistor N1 is turned off, a current path between the output node 315 and a ground voltage node is not formed.

When the enable signal EN1 is deactivated, the first selection signal generator 131 operates as follows.

When the enable signal EN1 is deactivated, the voltage of the node 313 is 0 V, and therefore, the NMOS transistor N2 of the DC path breaker 320 is turned off. Meanwhile, the NMOS transistor N1 is turned on and the voltage of the node 314 becomes 0 V, and therefore, the PMOS transistor P1 of the DC path breaker 320 is turned on so that the voltage of the node 311 becomes 2.5 V. Accordingly, the voltage levels of the source 312 and the gate 311 of the switch transistor PH1 are almost the same, and thus the switch transistor PH1 is not turned on. As a result, when the enable signal EN1 is deactivated, the switch transistor PH1 is turned off and leakage current does not occur. That is, the DC path from a boosted voltage node to a ground voltage node is not formed. When the enable signal EN1 is deactivated, since the NMOS transistor N1 and the NMOS depletion transistor NDH2 are turned on, the voltage of the output node 315 is discharged. In other words, when the enable signal EN1 is deactivated, the NMOS transistor N1 and the NMOS depletion transistor NDH2 form a discharge path from the output node 315 to the ground voltage node of the inverter I2, thereby decreasing the block selection signal OUT1 to the ground voltage level.

Figure 5:
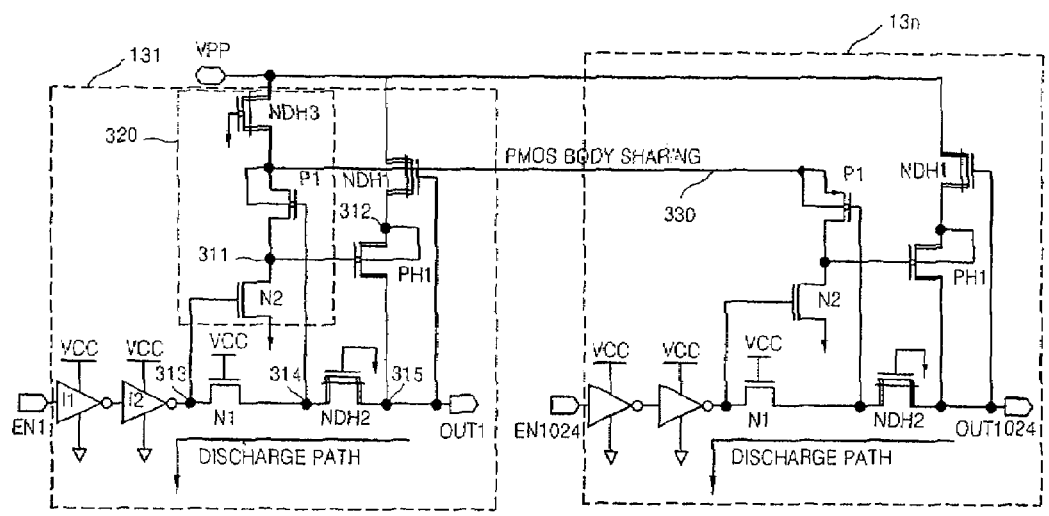
FIG. 5 is a circuit diagram of first through n-th selection signal generators shown in FIG. 1.

FIG. 5 is a circuit diagram of the first through n-th selection signal generators 131 through 13n shown in FIG. 2. Here, by way of example, it is assumed that "n", the number of memory blocks, is 1024.

Referring to FIG. 5, the first selection signal generator 131 is the same as that shown in FIG. 4. The other selection signal generators, i.e., second through 1024th selection signal generators 13n also have the same structure as the first selection signal generator 131, with the exception that the second through 1024th selection signal generators 13n do not separately include the NMOS depletion transistor NDH3 of the DC path breaker 320 but share the NMOS depletion transistor NDH3 included in the first selection signal generator 131.

A single body 330 of the PMOS transistor P1 of the DC path breaker 320 is shared by the first through n-th selection signal generators 131 through 13n. Since the single body 330 is used for the first through n-th selection signal generators 131 through 13n, the layout size of the row decoder 120 (FIG. 2) can be reduced. As a result, the overall size of a semiconductor memory device can also be reduced.

As described above, according to the present invention, a DC path is broken in a row decoder when the level of a supply voltage applied to a semiconductor memory device is low, and therefore, leakage current does not occur. As a result, power consumption is reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
a memory cell array comprising first through n-th memory blocks where "n" is 2 or a natural number greater than 2;
a row decoder decoding a block address signal and activating one block selection signal among first through n-th block selection signals to select one memory block among the first through n-th memory blocks; and
a row-line voltage level selector decoding a word line address signal and generating voltages to be respectively applied to row lines in a memory block corresponding to the activated one block selection signal,
wherein the row decoder comprises:
an address decoder decoding the block address signal and activating one enable signal among first through n-th enable signals; and
first through n-th selection signal generators each electrically connecting a boosted voltage node to an output node to activate the corresponding one block selection signal when the corresponding one enable signal among the first through n-th enable signals is activated and electrically breaking a path between the boosted voltage node and the output node and a path between the boosted voltage node and a ground voltage node when the corresponding enable signal is deactivated.

2. The semiconductor memory device of claim 1, wherein each of the first through n-th selection signal generators comprises:
a feedback circuit electrically connected to the output node to generate an output voltage that varies with a voltage level of the corresponding block selection signal;
a switch transmitting the output voltage of the feedback circuit to the output node; and
a direct current (DC) path breaker turning on the switch when the corresponding enable signal is activated and turning off the switch when the corresponding enable signal is deactivated.

3. The semiconductor memory device of claim 2, wherein the feedback circuit comprises a first negative-channel metal-oxide semiconductor (NMOS) depletion transistor having a first terminal connected to the output node and a second terminal receiving a boosted voltage, and the switch comprises a first positive-channel MOS (PMOS) transistor which is connected between the NMOS depletion transistor and the output node and turned on or off in response to an output voltage of the DC path breaker.

4. The semiconductor memory device of claim 3, wherein each of the first through n-th selection signal generators further comprises a discharge circuit discharging a voltage of the output node to a ground voltage node when the corresponding enable signal is deactivated, and the discharge circuit comprises a second NMOS depletion transistor connected between the output node and a predetermined node and a first NMOS transistor connected between the predetermined node and a node receiving the enable signal.

5. The semiconductor memory device of claim 4, wherein the DC path breaker comprises:
a third NMOS depletion transistor having a terminal connected to the boosted voltage node;
a second PMOS transistor connected between the third NMOS depletion transistor and the gate of the first PMOS transistor; and
a second NMOS transistor which is connected between the gate of the first PMOS transistor and the ground voltage node and is turned on or off in response to the enable signal, and
the third NMOS depletion transistor is shared by the first through n-th selection signal generators.

6. The semiconductor memory device of claim 5, wherein the first through n-th selection signal generators share a single body of the second PMOS transistor.

7. The semiconductor memory device of claim 1, wherein the semiconductor memory device is a flash memory device.

8. A row decoder of a semiconductor memory device, the row decoder comprising:
an address decoder decoding a predetermined address signal and activating an enable signal; and
a selection signal generator electrically connecting a boosted voltage node to an output node to activate a block selection signal when the enable signal is activated and electrically breaking a path between the boosted voltage node and the output node and a path between the boosted voltage node and a ground voltage node when the enable signal is deactivated,
wherein the selection signal generator comprises:
a feedback circuit electrically connected to the output node to generate an output voltage that varies with a voltage level of the block selection signal;
a switch transmitting the output voltage of the feedback circuit to the output node; and
a direct current (DC) path breaker turning on the switch when the enable signal is activated and turning off the switch when the enable signal is deactivated.

9. The row decoder of claim 8, wherein the feedback circuit comprises a first negative-channel metal-oxide semiconductor (NMOS) depletion transistor having a first terminal connected to the output node and a second terminal receiving a boosted voltage, and the switch comprises a first positive-channel MOS (PMOS) transistor which is connected between the NMOS depletion transistor and the output node and turned on or off in response to an output voltage of the DC path breaker.

10. The row decoder of claim 9, wherein the DC path breaker makes a voltage of a gate of the first PMOS transistor become a level of a ground voltage when the enable signal is activated and makes it become equal to or higher than a voltage of a source of the first PMOS transistor when the enable signal is deactivated.

11. The row decoder of claim 9, wherein the selection signal generator further comprises a discharge circuit discharging a voltage of the output node to a ground voltage node when the enable signal is deactivated, and the discharge circuit comprises a second NMOS depletion transistor connected between the output node and a predetermined node and a first NMOS transistor connected between the predetermined node and a node receiving the enable signal.

12. The row decoder of claim 11, wherein the DC path breaker comprises:
a third NMOS depletion transistor having a terminal connected to the boosted voltage node;
a second PMOS transistor connected between the third NMOS depletion transistor and the gate of the first PMOS transistor; and
a second NMOS transistor which is connected between the gate of the first PMOS transistor and the ground voltage node and is turned on or off in response to the enable signal.

* * * * *